Sept. 5, 1961 A. FEINER 2,999,169

NON-SATURATING TRANSISTOR PULSE AMPLIFIER

Filed Dec. 28, 1956

INVENTOR
A. FEINER
BY William F. Simpson
ATTORNEY

United States Patent Office

2,999,169
Patented Sept. 5, 1961

2,999,169

NON-SATURATING TRANSISTOR PULSE AMPLIFIER

Alexander Feiner, New York, N.Y., assignor to Bell Telephone Laboratories, Incorporated, New York, N.Y., a corporation of New York

Filed Dec. 28, 1956, Ser. No. 631,132
8 Claims. (Cl. 307—88.5)

This invention relates to pulse amplifiers, more particularly to transistor pulse amplifiers, having a high gain, high speed, and high sensitivity.

In order to secure high gain and high sensitivity, it is desirable that the first stage of a pulse amplifier be of the grounded emitter type because this circuit configuration provides high gain and high sensitivity. However, transistor amplifiers of this type when arranged to have a fast pulse rise time, saturate and when saturated have a delay in the shut-off time or pulse fall or restoration time. This phenomenon is more pronounced in the junction type transistors and is due to the time required to sweep out the carriers in the base region. If it is attempted to maintain the transistor outside of the saturation region, then the available output is decreased and the rise time in response to input pulses is increased.

In the past when negative feedback has been employed in transistor amplifiers of this type to attempt to overcome this difficulty, trouble has been encountered, due to the fact that the circuit arrangement tends to become short-circuit unstable and destroy the transistors. If sufficient resistance is connected in the input circuit or in the emitter circuit to render the system short-circuit stable, then the advantages of high gain and high sensitivity inherent in the grounded emitter configuration are largely lost and the circuit becomes insensitive and has relatively low gain.

One way for partially overcoming these difficulties is to connect a diode in feedback path and bias it so that the feedback path is normally ineffective or inoperative until a predetermined potential is obtained on the output circuit, at which time the feedback path becomes effective and tends to further limit the gain of the transistor. Such an arrangement is shown in the co-pending application of R. R. Blair and J. R. Harris, Serial No. 587,888, filed May 28, 1956, now Patent No. 2,887,542.

In accordance with my invention, pulse amplifier circuits of the grounded or common emitter type are further improved by employing a feedback transistor in the feedback circuit. The feedback transistor has its input connected so that it is normally inoperative till the output of the amplifier circuit reaches a predetermined level. When the output of the amplifier reaches the predetermined level the feedback transistor becomes operative and introduces gain in the feedback circuit. With this arrangement, the operation of the feedback circuit is more rapid and more effective, so that the transistor circuits may more nearly approach the saturation level without actually becoming saturated. Thus both the pulse rise time and fall or decay time of the amplifier may be very short, while the transistor output may be substantially its maximum unsaturated value.

In accordance with still another feature of this invention, transistor pulse amplifiers are still further improved by connecting a delay device or delay network connected in the feedback path, so that initially the feedback circuit is inoperative and then, after a portion of the pulse interval, i.e., a quarter or more of the pulse interval, the feedback path becomes effective and reduces the output of the transistor amplifier. In this manner, the rise time may be made a minimum and then the transistor output reduced from the saturation region, so that the fall or restoration time may also be a minimum.

A still further object of this invention is to further improve the stability and reliability of a pulse amplifier of the grounded emitter type, wherein a grounded collector stage is provided following the grounded emitter and employed to obtain the output voltage and the feedback voltages.

A feature of this invention relates to pulse amplifiers embodying this invention, wherein no phase reversal commonly encountered in grounded emitter stages is obtained.

The foregoing and other objects and features of this invention may be more readily understood from the following description when read with reference to the attached drawings, in which FIG. 1 shows an exemplary embodiment of this invention employing a transistor connected in a feedback path of a grounded emitter pulse amplifier;

Figure 1:
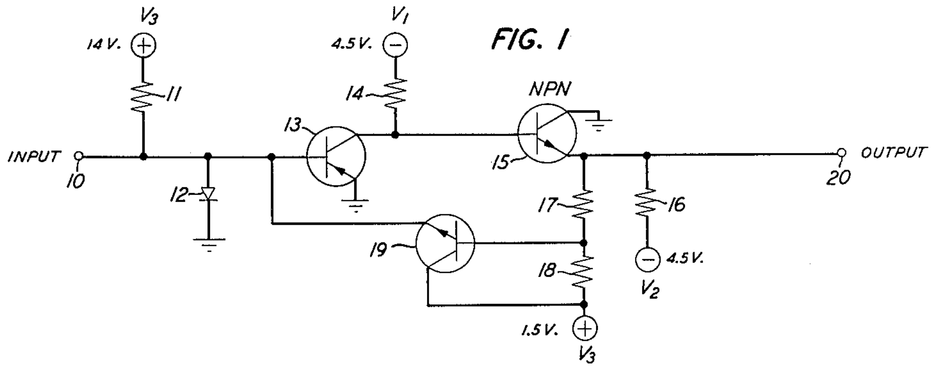
FIG. 1 shows an exemplary embodiment of this invention wherein a junction type transistor 13 is connected in a grounded or common emitter circuit configuration and the collector or output of this amplifier in turn connected to a second junction transistor connected in a grounded or common collector circuit arrangement, having a low output impedance.

As shown in FIG. 1, the circuit is arranged to respond to negative input pulses, so that the transistor 13 is of the so-called PNP type, while the transistor 15 is of the NPN type. When these transistors are of these types, they are directly connected as shown.

If it is desired to arrange the amplifier to respond to positive pulses instead of negative pulses, then the types of transistors will be reversed and the polarities connected to the circuit also reversed. A diode 12 will likewise be reversed.

The input terminal 10 is connected through resistor 11 to a positive voltage source, and also through the diode 12 to a ground. This input terminal 10 is likewise connected to the input or base terminal of the transistor 13. The emitter terminal of this transistor is connected to ground and the collector is connected through the collector impedance or resistor 14 to a source of negative potential.

Resistor 11 and diode 12 are connected to the input circuit to supply the proper bias currents to the transistor 13 to normally maintain this transistor cutoff or non-conducting.

A small positive current is normally supplied through resistor 11 from a positive voltage source which current flows through the diode 12. Diode 12 is employed to clamp or maintain the input terminal at a small positive potential near ground, which maintains the transistor 13 non-conducting, because the emitter circuit has a very small reversed voltage or bias applied to it, due to the small voltage drop acorss the diode 12.

The forward impedance of the diode 12 is quite low so if a more positive voltage is applied to the input terminal 10 the diode 12 effectively short circuits or shunts this positive voltage, which voltage merely tends to further back bias the emitter circuit of the transistor 13 and is thus without further effect upon the circuit.

However, when a negative input voltage or pulse is applied to terminal 10, this terminal becomes more negative and causes the diode 12 to become reversed bias and therefore changes to a high impedance. At the same time, the emitter circuit of the transistor 13 becomes forward biased, causing emitter current to flow, which in turn causes collector current to flow in this transistor through the collector resistor or impedance 14. As a result, an amplified output is obtained in the collector circuit of the transistor 13. This output is applied to the base of the transistor 15.

As described above, the transistor 15 is connected in a common collector circuit, which circuit is sometimes called an emitter follower circuit because the voltage of the emitter follows the input voltage applied to the base. As shown in FIG. 1, the transistor 15 has its emitter connected to a negative voltage source through the output or load resistor or impedance 16. The voltage drop across resistor 16 is less than the voltage drop across resistor 14 so that the emitter circuit of the transistor 15 is normally forward biased. As a result, the emitter potential is substantially the same as the base potential.

The emitter of transistor 15 is connected to the output terminal 20 and also to the voltage divider resistors 17 and 18. Current flows from the positive voltage source V3 through these resistors to the emitter terminal of the transistor 15. As a result, the emitter circuit of the feedback transistor 19 is negative or reversed biased, so that no current normally flows in either the emitter or collector circuit of the feedback transistor in 19.

However, when a negative voltage is applied to the input terminal 10, as described above, the collector terminal of the transistor 13 becomes less negative or more positive, due to the increased current flowing through the collector resistor 14. This more positive voltage is applied to the base of transistor 15, which causes its output terminal to be more positive, thus applying a more positive voltage to the output terminal 20. In addition, more positive voltage is applied to the voltage divider resistors 17 and 18.

When this more positive voltage exceeds a predetermined value, the voltage drop across resistor 18 causes the emitter circuit of the feedback transistor 19 to become forward biased, with the result that current flows in the emitter circuit of this transistor and provides a low impedance path through the collector and emitter junctions of the transistor 19 to the input terminal 10, thus shunting out any additional input current which is applied to the input terminal 10. Thus, input current above a predetermined value is prevented from being applied to or flowing to the base circuit of the transistor 13. The circuit is also stable, since there is no tendency for the circuit to become short-circuit unstable or burn out the transistor 13.

At the termination of the pulse applied to terminal 10, the input current is reduced so that the positive current through resistor 11 again becomes controlling and flows through the diode 12, which thereupon changes to a low impedance and back biases the emitter circuit of the transistor 13, thus cutting off current in the collector circuit of this transistor. As a result, the collector becomes more negative and applies a more negative voltage to the base of the transistor 15. Consequently the output terminal 20 also becomes more negative and in addition the feedback transistor 19 becomes back biased, with the result that this transistor ceases to conduct current and the circuit is restored to its initial condition.

Thereafter, the above-described operation is repeated in response to each applied input pulse.

In each case, the positive excursion of the input voltage or current is limited by the diode 12 and the negative excursion of the input pulses limited by the feedback transistor 19. In each case, the devices become conducting and limit the current applied to the base of the transistor 13, so that the emitter current of this transistor never enters a saturated region, with the result that the current in the collector circuit is turned on at the high speed and also turned off at substantially the same high speed, thus causing the pulses to be accurately amplified and repeated and these accurately repeated pulses in turn repeated in the output circuit of the emitter follower transistor 15.

Figure 2:
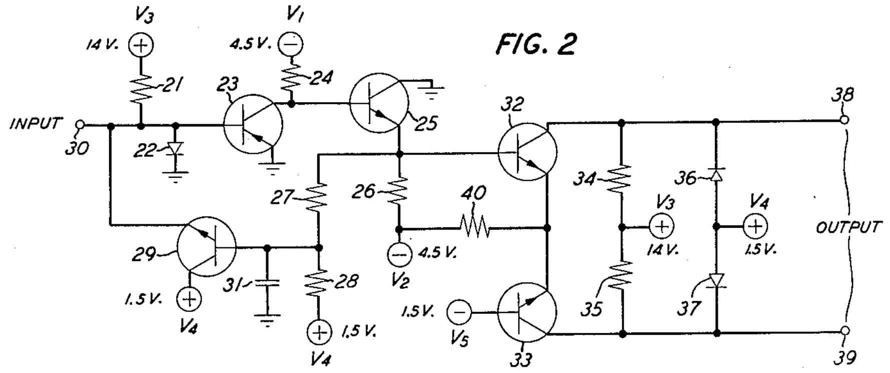
FIG. 2 shows a similar high gain, high sensitivity, high speed pulse amplifier employing both a transistor and a delay network in the feedback path. This amplifier is arranged to drive a push-pull output amplifier.

The amplifier shown in FIG. 2 is similar in construction to the amplifier shown in FIG. 1. The input terminal is designated 30 and is connected to the base of the transistor 23. The collector of this transistor is, in turn, direct connected to the base of the emitter follower transistor 25. Here again the transistor 23 is a PNP type transistor, while the transistor 25 is an NPN transistor. The voltages connected to these transistor amplifiers are similar to the voltages shown in FIG. 1, and the amplifier is arranged to respond to negative pulses applied to the input terminal 30. Here, as before, the diode 22 limits the positive excursions of the input 30, while the resistor 21 and the source V3, together with the diode 22, control the steady state residual current supplied to the base and emitter circuits of the transistor 23, thus maintaining this transistor cut off.

The transistor 25 is normally conducting since the residual current through the resistor 24 from source V1 and the voltage dividing network, comprising resistors 26, 27 and 28 connected to the emitter circuit of the transistor 25 cause current to normally flow in this transistor, maintaining the emitter junction forward biased, so that the voltage of the emitter is at substantially the same voltage as the collector of the transistor 23. The output or emitter of the transistor 25 is connected through the voltage divider resistors 27 and 28 to the base of a second NPN feedback transistor 29. The emitter of this transistor is connected to the input terminal 30 and base of the transistor 23. The normal voltage drop across the resistor 28 is sufficient to maintain the transistor 29 normally cut off, so that it passes only a small residual current in the absence of a negative signal applied to the input terminal 30.

As before, upon the application of a negative pulse to the input terminal 30, the diode 22 becomes back biased and changes to a high impedance, whereas the emitter junction of the transistor 23 becomes forward biased and causes current to flow through the emitter circuit and thus in the collector circuit produce an amplified voltage change across resistor 24. This voltage change in turn applied to the base of the emitter follower transistor 25 with the result that this emitter becomes more positive. This more positive voltage is applied to the output of the amplifier, as will be presently described.

The more positive voltage from the emitter of the emitter follower transistor 25 is also applied to the voltage dividing resistors 27 and 28. In the absence of the condenser 31, when the voltage of the junction of resistors 27 and 28 becomes sufficiently positive, the transistor 29 in the feedback circuit becomes conducting and provides a low impedance path from the input terminal 30 to the source of positive potential V4, thus tending to shunt or by-pass any further negative increases in voltage of the input pulse applied to the base of the transistor 23. This tends to prevent the base current from rising to the saturation value of this transistor when the values of the resistors 27 and 28 are properly chosen.

However, condenser 31 is connected to the common points of resistors 27 and 28 in the base of the transistor 29 and causes a delay in the change in voltage developed across the resistor 28 during the time the charge on this condenser is changing. During this delay interval, the feedback transistor 29 remains inoperative so that the negative going input pulse applied to the input terminal 31 may drive the emitter circuit of the transistor 23 into a saturation region. Thus, the rise time of the output voltage of the transistor 23 may be made a minimum, thus causing the maximum speed of response.

Then, a short time interval later, determined by the constants of the delay circuits connected to condenser 31, the transistor 29 will become conducting and reduce the input current to the base of the transistor 23, thus causing the emitter current of this transistor to fall below the saturation value.

The delay interval of the delay network connected in the circuit of the base of the feedback transistor 29 is selected to be a small portion of a pulse interval so that during the remaining portion of the pulse interval ample time is provided for the transistor 23 to have its current reduced below the saturation value. Then, at the termination of the pulse, the turnoff time will also be a minimum, thus giving the circuit the fastest possible recovery time.

By thus providing a short delay interval in the feedback circuit, the rise time and the fall time of the current in the amplifying transistor 23 will be a minimum. As a result, the speed of operation at both the beginning and termination of the pulses is increased and the reliability of the circuit further enhanced.

As shown in FIG. 2, the output of the emitter follower transistor 25 is coupled to the base of another transistor amplifier 32. This amplifier 32 is also an emitter follower and is connected in a circuit with a second NPN transistor 33 by means of a common emitter resistor 40. Thus the emitter transistor follower 33 operates as a phase inverting transistor with the result that balanced or push-pull signals are obtained from the emitters of the transistor amplifiers 32 and 33. In this case, the diodes 36 and 37, together with the clamping voltage V4, are provided to limit the negative excursions of the outputs of these amplifiers.

In the amplifiers shown in FIGS. 1 and 2, a negative pulse supplied to the input terminals appears as a positive going pulse applied to the output terminals. In other words, a phase reversal takes place in these amplifiers.

Figure 3:
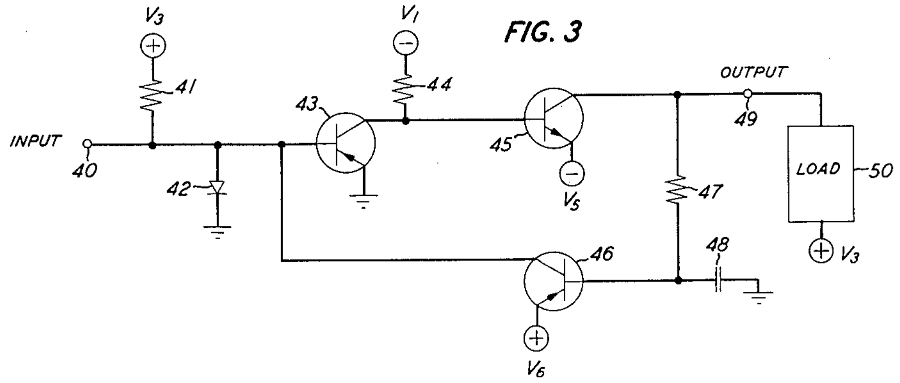
FIG. 3 shows a pulse amplifier in accordance with an exemplary embodiment of this invention employing a transistor having a high gain connected in the feedback path, wherein a phase reversal between the input and output of the amplifier is not obtained.

In the amplifier shown in FIG. 3, no such phase reversal takes place. Here an input transistor 43 has its base connected to the input terminal 40 and is arranged in the grounded emitter configuration. This transistor amplifier is a PNP type, just as the transistors 13 and 23. This amplifier is connected to the base circuit of an NPN transistor amplifier 45. This amplifier, however, is connected with a grounded emitter, just as the amplifier transistor 43. As a result, the transistor 43 inverts the signals and then the transistor amplifier 45 again inverts them, so that a negative going signal applied to the input terminal 40 is repeated by the transistor amplifier 43 as a positive going pulse applied to the base of the grounded emitter transistor amplifier 45. This amplifier again inverts the pulse so that a negative going pulse is repeated in its collector circuit and applied to the load circuit 50.

As before, the positive excursion of the input voltage is limited by the diode 42 and the normal bias currents are applied to the transistor 43 by the resistor 41 and the source of positive voltage V3. As a result, the diode 42 is normally forward biased so that it has a low impedance, while the emitter junction of the transistor 43 is reverse biased, so that only small residual currents flow in the transistor circuit 43. Likewise, the emitter junction of the transistor amplifier 45 is reverse biased, because the voltage applied to the base circuit and that applied to the emitter circuit tends to reverse bias this junction in the absence of an input signal.

However, when a negative going pulse is applied to the input terminal 40, then the diode 42 becomes reverse biased and has a high impedance, while the emitter junction of the transistor amplifier 43 becomes forward biased and conducts current and presents a relatively low impedance to the input terminal and causes an amplified voltage to be repeated across the collector resistor 44.

This voltage is connected to the base of the transistor amplifier 45, which in turn causes a voltage to be repeated in its collector circuit which is negative going and thus in the same phase as the input voltage of 40. This voltage, in addition to being connected to the load 50, is shown connected to the base of the transistor amplifier connected in the feedback circuit. This amplifier is also of the grounded emitter variety and as a result again inverts the phase of the current and is connected to the input terminal 40 and the base of the transistor amplifier 43. The biases applied to the transistor 46 in the feedback circuit are likewise adjusted so that this transistor is normally non-conducting.

However, when the output voltage of the transistor 45 exceeds a predetermined magnitude, then the transistor amplifier 46 becomes operative and provides a low impedance path from the input terminal 40 and base of the transistor 43 to a source of positive voltage V6, with the result that a low impedance path is provided for further increases in current from the input terminal, thus preventing the transistor 43 from entering the saturation region in its emitter circuit.

When the transistor 43 is prevented from entering the saturation region, the transistor 46 is likewise prevented from having its emitter circuit enter the current saturation region. As a result, neither one of these transistors enters in the saturation region so that the amplifier is stable and when the negative going input pulse terminates, the currents in these amplifiers immediately restore to their initial condition.

When desired, a time delay comprising, for example, resistor 47 and condenser 48, may be inserted in the input circuit of the feedback transistor 46 and thus in the feedback circuit. This time delay has a time delay interval equal to a small fraction of a pulse interval similar to the time delay caused by the condenser 31. This time delay in the feedback circuits operates in the same manner as described above with reference to the time delay caused by the condenser 31 in FIG. 2. Thus, at the beginning of the pulse, the transistor amplifier 46 is inoperative, with the result that the transistors 43 and 45 have their emitter circuits or emitter junctions driven into the saturated current region, but after a short fraction of the pulse interval, the transistor amplifier 46 becomes operative and reduces the input current to the transistor 43, with the result that this transistor has the current in its emitter circuit reduced below the saturation value. As a result, the current in the emitter circuit of the transistor 45 is likewise reduced, so that these transistors are no longer operating in the saturated region.

Then, when the pulse terminates the currents in these transistors, it is substantially immediately restored to its initial conditions without any time delay caused by the excess of carriers in the base portion of the transistor.

Thus the amplifier circuit of FIG. 3 operates in substantially the same manner as the amplifiers shown in FIGS. 1 and 2, except that no phase reversal takes place between its input and output circuits.

It is to be understood that the above-described arrangements are illustrative of the application of the principles of the invention. Numerous other arrangements may be devised by those skilled in the art without departing from the spirit and scope of the invention.

What is claimed is:

1. A transistor pulse amplifier comprising in combination a first transistor having a base, an emitter and a collector, a common reference point, means for interconnecting said emitter with said common reference point, an input terminal, means for interconnecting said base with said input terminal, an output for said amplifier, means for interconnecting said collector and said output, negative feedback circuit means connected between said input terminal and said output for transmitting an individual pulse to said input terminal responsive solely to each pulse in said output to prevent saturation of said transistor, a second transistor connected in said feedback circuit to control said feedback circuit, and bias means interconnected with said second transistor for blocking said feedback circuit when the output of said amplifier is below a predetermined level.

2. A transistor pulse amplifier comprising in combination a first transistor having a base, an emitter and a collector, a common reference point, means for interconnecting said emitter with said common reference point, an input terminal, means for interconnecting said base with said input terminal, an output for said amplifier, means for interconnecting said collector and said output, a negative feedback circuit connected between said input terminal and said output to transmit each pulse of the output to the input independently of all other pulses of said output for preventing saturation of said transistor, a second transistor connected in said feedback circuit to control said feedback circuit, bias means interconnected with said second transistor for blocking said feedback circuit when the output of said amplifier is below a predetermined level, and delay means connected in said feedback circuit to delay the pulses transmitted by said feedback circuit for a predetermined interval of time greater than the rise time of pulses at said output.

3. A transistor pulse amplifier comprising in combination a first transistor connected in a common emitter circuit having an input and an output, a second transistor connected in an emitter follower circuit having an input and an output, means for interconnecting the output of the circuit of said first transistor circuit to the input of the circuit of said second transistor circuit, a negative feedback circuit means interconnected between the output of the circuit of said second transistor circuit and the input of the circuit of said first transistor circuit for conveying pulses to said input circuit individual to each pulse of said output for preventing saturation of said first transistor, a third transistor connected in said feedback circuit for controlling said feedback circuit, bias means interconnected with said third transistor for blocking said feedback circuit when the output level in the output of the second transistor circuit is below a predetermined level, and delay means connected in said feedback circuit for delaying the operation of said third transistor for at least a fraction of a pulse interval which is greater than the minimum rise time of pulses at said output.

4. A transistor pulse amplifier comprising in combination a first transistor connected in a common emitter circuit having an input and an output, a second transistor connected in a common emitter circuit having an input and an output, means for interconnecting the output circuit of said first transistor to the input of the circuit of the second transistor, negative feedback circuit means for transmitting each individual pulse from the output circuit of said second transistor to the input of the circuit of said first transistor independent of all other pulses of said output circuit for preventing saturation of said first transistor, a third transistor connected in said feedback circuit for controlling the transmission of energy through said feedback circuit, bias means interconnected with said third transistor for normally preventing the transmission of energy through said feedback circuit, means for overcoming said bias means in response to an output level in the output of the circuit of said second transistor in excess of a predetermined value, and delay means for delaying the transmission of energy through said feedback circuit for at least a portion of a pulse which is greater than the minimum rise time of pulses in said output.

5. A transistor pulse amplifier comprising in combination a first transistor having a base, an emitter and a collector, a common reference point, means for interconnecting said emitter to said common reference point, an input terminal, means for interconnecting said base with said input terminal, an output for said amplifier, means for interconnecting said collector with said output, feedback circuit means interconnected between said input terminal and said output terminal for applying an individual pulse to said input terminal responsive solely to each pulse in said output and independent of all other previous or subsequent pulses in said output to prevent saturation of said first transistor, said feedback circuit means including a second transistor connected in shunt with said input terminal, bias means interconnected in said feedback circuit with this said second transistor to apply an operative bias to said second transistor when the output of said amplifier exceeds the predetermined value whereby said second transistor prevents the application of a saturating current to said first transistor.

6. A transistor pulse amplifier comprising in combination a first transistor having a base, an emitter and a collector, a common reference point, means for interconnecting said emitter with said common reference point, an input terminal, means for interconnecting said base with said input terminal, an output for said amplifier, means for interconnecting said collector and said output circuit, a negative feedback circuit connected between said input terminal and said output terminal for conveying a feedback pulse to said input terminal individual to each pulse in said output which feedback pulse is independent on all other pulses in said output for preventing saturation in said first transistor, and delay means interconnected in said feedback circuit to delay the application of each of said pulses transmitted through the feedback circuit to said input terminal for a predetermined fraction of a pulse interval greater than the minimum rise time of pulses in said output.

7. A transistor pulse amplifier comprising in combination a first transistor having a base, an emitter, and a collector, a common reference point, means for interconnecting said emitter with said common reference point, an input terminal, means for interconnecting said base with said input terminal, an output for said amplifier, means for interconnecting said collector and said output, negative feedback means for securing both a rapid rise time and a rapid fall time of output pulses in said output circuit connected between said input terminal and said output to transmit each pulse of said output to the input independently of all other pulses of said output for preventing saturation of said transistor, a second transistor connected in said feedback means to control said feedback means, and delay means connected in said feedback means to delay the operation of said second transistor.

8. A transistor pulse amplifier in accordance with claim 7 wherein said delay means comprises a capacitor connected between said common reference point and the input of said second transistor.

References Cited in the file of this patent

UNITED STATES PATENTS

| | | |
|---|---|---|
| 2,208,665 | Crabtree | July 23, 1940 |
| 2,369,066 | Maxwell | Feb. 6, 1945 |
| 2,475,258 | Scott | July 5, 1949 |
| 2,497,691 | Schroeder | Feb. 14, 1950 |
| 2,544,340 | Maxwell | Mar. 6, 1951 |
| 2,585,077 | Barney | Feb. 12, 1952 |
| 2,791,739 | Light | May 7, 1957 |
| 2,801,296 | Blecher | July 30, 1957 |
| 2,902,548 | Moeller | Sept. 1, 1959 |

OTHER REFERENCES

Neale et al.: "Transistor D.C. Amplifier" in Wireless World, November 1956, pages 529–532.